United States Patent [19]

Rittenbach

[11] 4,334,194

[45] Jun. 8, 1982

[54] PULSE TRAIN GENERATOR OF PREDETERMINED PULSE RATE USING FEEDBACK SHIFT REGISTER

[75] Inventor: Otto E. Rittenbach, Neptune, N.J.

[73] Assignee: The United States of America as represented by the Secretary of the Army, Washington, D.C.

[21] Appl. No.: 148,324

[22] Filed: May 9, 1980

Related U.S. Application Data

[63] Continuation-in-part of Ser. No. 973,642, Dec. 26, 1978, Pat. No. 4,237,464.

[51] Int. Cl.³ ............... H03K 21/34; H03K 21/06
[52] U.S. Cl. .............................. 328/42; 328/37; 328/61
[58] Field of Search ............. 328/43, 42, 46, 61, 328/48, 37; 307/224 R, 225 R

[56] References Cited

U.S. PATENT DOCUMENTS

| | | | |
|---|---|---|---|
| 3,258,696 | 6/1966 | Heymann | 328/37 |
| 3,493,872 | 2/1970 | Sepe | 307/224 R |
| 3,614,632 | 10/1971 | Leibowitz et al. | 328/48 |

Primary Examiner—John S. Heyman
Attorney, Agent, or Firm—Nathan Edelberg; Jeremiah G. Murray; John W. Redman

[57] ABSTRACT

A pulse train generator comprising a shift register with feedback for producing an output pulse for every m clock pulses applied to the shift register stages. The feedback shift register normally has a maximal length $2^n-1$, where n is the number of stages. Clock pulses are applied to the shift register until an all-ONE condition is reached; thereupon, (m-1) additional clock pulses are applied and the states of the register stages can then be sensed. Appropriate gate circuits are added to the shift register, depending upon the sensed register states, to inhibit certain shifts and to insure that the register is returned to the all-ONE condition upon arrival of every mth clock pulse.

6 Claims, 1 Drawing Figure

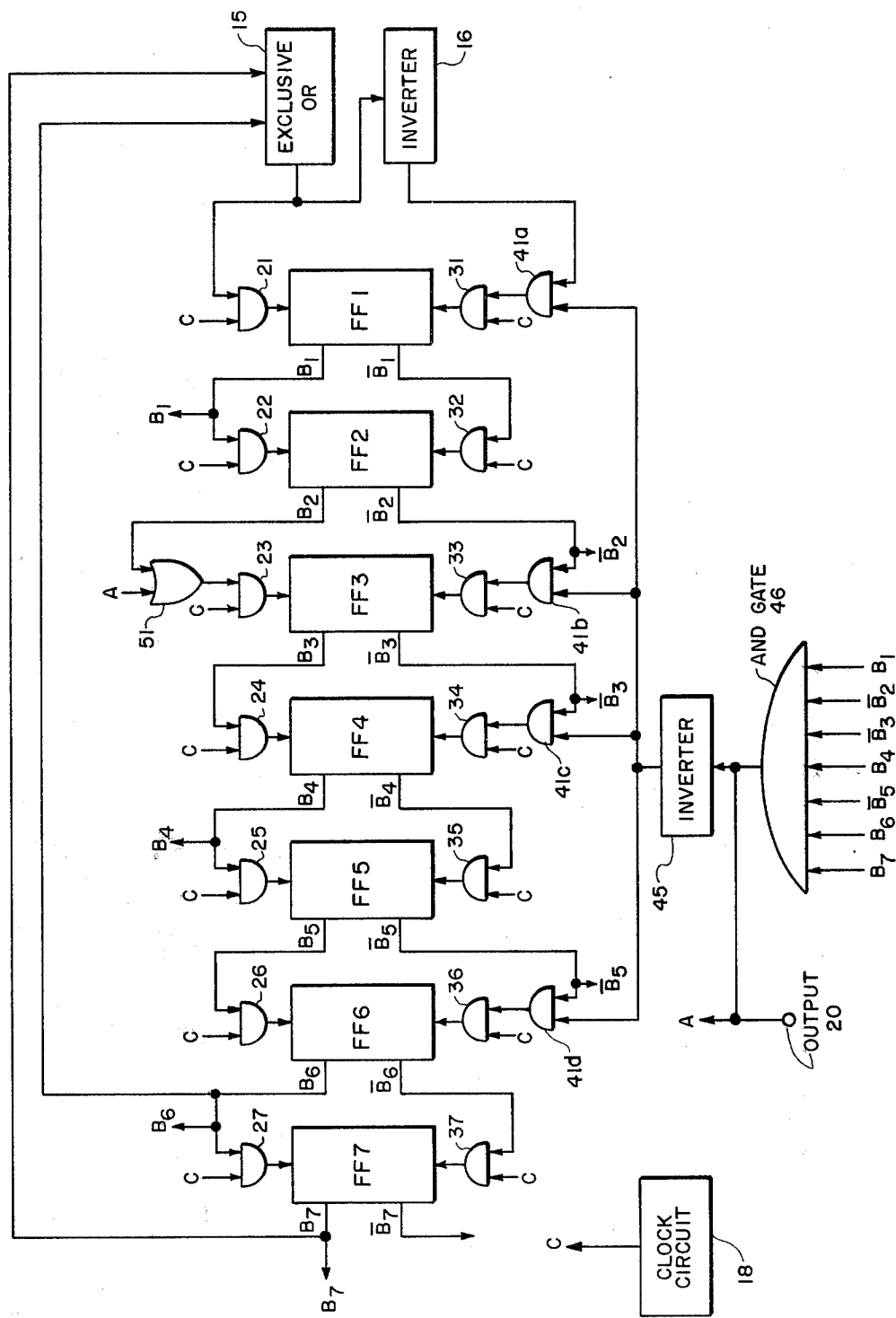

PULSE TRAIN GENERATOR OF PREDETERMINED PULSE RATE USING FEEDBACK SHIFT REGISTER

This invention may be manufactured by or for the Government, for governmental purposes, without the payment of any royalties thereon or therefor.

This application is a continuation-in-part of my parent application, Ser. No. 973,642 entitled "Radar Antenna," filed Dec. 26, 1978, now U.S. Pat. No. 4,237,464.

In this application, another of my co-pending applications, Ser. No. 973,356, filed Dec. 26, 1978 now U.S. Pat. No. 4,219,812, entitled "A Range-Gated Pulse Doppler Radar System," was referred to; the radar system described therein includes circuitry for generating a periodic pulse train having a code length $2^N - 1$ bits per period. K bits are transmitted, then M bits are passed over, then K more bits are transmitted, etc. The sum $(K+M) = m$ and the number $2^N - 1$ must not have any primary factors in common. A pulse generator according to the present invention provides means for obtaining an output pulse for every m bits of the code length.

The question is, what type of counter will best fill the requirements of the pulse generator? The requirements are a minimum; the counter need only count to m, reset, and count to m again, ad infinitum. The only indication necessary is a pulse, indicating that the count of m has been reached. The result is a series of pulses spaced m bits apart. For a typical application wherein $m = 89$, the minimum number of multivibrators necessary to meet these requirements is seven. The number and type of gates will depend on the counter type.

The most straightforward approach is a gated binary counter; however, as is well known, in such a counter the gate size tends to get very large, i.e. there are many inputs per gate. By grouping similar signals, the gate size may be decreased, but then the gates must be cascaded. Regardless of how the signals are grouped, such a counter requires many components, and hence is unattractive.

A binary-coded decimal counter could also be used but would have no advantage in this case since such a counter requires more multivibrators and more gates. The only practical advantage is the ease of obtaining a base ten indication of the count.

A binary counter which is less complicated than the logic gated binary counter is one in which the clock pulses can be gated. The only real problems that might arise with such a counter are clock delay and clock degradation as the clock pulse travels along the counter. The delay of one clock pulse gate multiplied by seven gates, added to the delay of the last multivibrator is likely to become appreciable compared to 200 nanoseconds (the clock period). Even if it were possible to build a gate that operated fast enough, each gate would use at least one transistor and the design of the gate would be a considerable task.

Perhaps the simplest binary counter is the complementing counter which, of course, uses the output of the preceding multivibrator as a clock pulse for the following multivibrator. If this type of counter could be made to work at 5 MHz, it would be the simplest to build. Unfortunately, in such a counter not only do the delays of the multivibrators add, but the rise times of the multivibrators are greater than that of the clock pulse generator. This increases the delay of an individual multivibrator. However, the total delay of the counter cannot be greater than 200 nonoseconds (the reciprocal of the radar clock rate of 5 MHz) because, after a count of $2^7 = 128$ is reached, the counter must be reset to 39 before the next clock pulse arrives, in order to count to $128 - 39 = 89$.

In accordance with the invention, as indicated in FIGURE, the counter used is a shift register with feedback which normally would be connected to generate a maximal length pseudorandom sequence of $2^n - 1 = 127$. The shift register of the invention is modified so that after $m-1$ clock pulses certain shifts are inhibited, whereupon the register is returned to the all-ONE state at the mth clock pulse.

The pulse train generator of the single FIGURE of the drawing includes an n-stage shift register with an Exclusive OR gate 15 and an inverter 16 connected between the final stage or flipflop FF7 and the first stage FF1. The Exclusive OR gate 15 enables the maximum count of the shift register to increase from n to $2^n - 1$. As shown by way of example in FIGURE, the shift register includes seven flipflops FF1 through FF7, each of which includes first and second inputs—indicated at the top and bottom of each flipflop—and first and second complementary outputs B and $\overline{B}$. The inputs to the Exclusive OR gate 15 are derived from the B outputs of the last flipflop FF7 and one of the other flipflops, in this case, the next to last flipflop FF6. The Exclusive OR gate 15 has a ONE in the output whenever the two B outputs $B_6$ and $B_7$ of stages FF6 and FF7 are of differing state and has a ZERO in the output whenever the two outputs $B_6$ and $B_7$ are either both ONES or are both ZEROS.

The number n of flipflops used will determine the normal maximum length of the feedback shift register, which is given by $2^n - 1$ when an Exclusive OR gate is used in the feedback circuit. For the seven stage shift register shown in FIGURE, the maximum length would be $2^7 - 1 = 127$. After 127 clock pulses C, the outputs of the shift register stages will resume its original sequence. If less stages, say 6 stages, are used, the maximum length of the shift register would be 63. The shift register of FIGURE includes a plurality of AND gates 21 to 27, the output of each of which is connected to a first (B) input of a corresponding one of the flipflops FF1 to FF7. A plurality of AND gates 31 to 37 are further provided; the output of each of the AND gates 31 to 37 is connected to a second ($\overline{B}$) input of respective flipflops FF1 to FF7. All of the AND gates 21 to 27 and 31 to 37 are receptive of clock pulses C from a clock circuit 18. In the prior art, wherein gates 41 and 51 are not used, whenever a clock pulse arrives at the AND gates of a given flipflop, the AND gate in question will be enabled, provided the other input to that AND gate directly connected to the previous stage, or to the Exclusive OR gate 15 and inverter 16, as the case may be, is ONE, and if the state of the preceding stage is a ONE, it can be transferred to the next flipflop. If the output of the Exclusive OR gate 15 is a ONE when a clock pulse arrives at AND gate 21 and, hence, the output of the inverter 16 is a ZERO when a clock pulse arrives at AND gate 31, these outputs can be transferred to the B or $\overline{B}$ input circuit, respectively, of the first flipflop FF1. If the B or $\overline{B}$ output of a given stage is ZERO, that ZERO can be changed to a ONE upon arrival via the appropriate AND gate of a ONE at the corresponding B or $\overline{B}$ input circuit of that flipflop; that is to say, the state of the flipflop can be changed. The arrival of a ZERO via the appropriate AND gate, on the other hand, will not affect a change of state of the associated flipflop.

If an output pulse is desired at intervals of m clock pulses, where $m < 2^n - 1$, the shift register is modified in a manner now to be described.

First, the shift register is connected in the manner of the prior art, with the first or B outputs of each of the first six stages FF1 to FF6 connected to one of the inputs to that one of AND gates 22 to 27 which is in the first (B) input to the next stage. For example, the $B_2$ output from stage FF2 forms one input to the AND gate 23. The output of the Exclusive OR gate 15 is connected to one input of the AND gate 21 of the first stage FF1. Further the second or $\overline{B}$ outputs of each of the first six stages connected to an input of that one of the AND gates 32 to 37 which is in the second or $\overline{B}$ input circuit of the next stage. For example, the $\overline{B}_5$ output from stage FF5 is connected to an input of AND gate 36. The output of the inverter 16 is connected to an input of the AND gate 31 of the first stage FF1. Clock pulses C from clock circuit 18 are applied to the other input of the various AND gates 21 to 27 and 31 to 37. The n-input AND gate 46, inverter 45 and additional AND gates 41 and any OR gates 51 are not now in the circuit.

A number of clock pulses can be concurrently applied to AND gates 21 to 27 and 31 to 37 until all of the first (B) outputs of the shift register stages contain ONEs. If the interval between m clock pulses is to be equal, an additional m−1 clock pulse can now be applied to above mentioned AND gates and the condition of the various flipflops reexamined. This could also be accomplished by computer simulation.

The n-input AND gate 46 and inverter 45 are now connected into the shift register circuit, as indicated in the FIGURE. The combination of AND gate 46 and inverter 45 from an n-input NAND gate. The first or B outputs of these flipflops which contain a ONE are connected to the multiple input AND gate 46; likewise, the complementary second ($\overline{B}$) outputs of any of the flipflops which contain a ZERO in the corresponding first or B output are connected to the multiple-input AND gate.

In order to illustrate the types of combinations of outputs of the various stages with but a single drawing FIGURE, it will be assumed that, for a pulse generator of repetition rate equal to the time interval for m clock pulses, that the B outputs of stages FF1 to FF7, after the arrival of the (m−1)th clock pulse, contain the sequence 1101001, with the first digit representing the output of the last stage FF7. Table I represents the state of the various flipflops for this assumed condition after m−1 clock pulses.

TABLE I

| Flipflop | Outputs B | $\overline{B}$ | EX OR 15 | INVERTER 16 |
|---|---|---|---|---|
| FF7 | 1 | 0 | 0 | 1 |
| FF6 | 1 | 0 | | |
| FF5 | 0 | 1 | | |
| FF4 | 1 | 0 | | |
| FF3 | 0 | 1 | | |
| FF2 | 0 | 1 | | |
| FF1 | 1 | 0 | | |

In accordance with the previously mentioned rule for inputs to the n-input AND gate 46, the first outputs $B_1$, $B_4$, $B_6$ and $B_7$ from respective first, fourth, sixth and seventh stages and the second outputs $\overline{B}_2$, $\overline{B}_3$ and $\overline{B}_5$ from the respective second, third and fifth stages are connected to the n=7 inputs to AND gate 46.

It should be understood that the particular flipflop outputs connected to the inputs of AND gate 46 depend upon the contents of the outputs of the various stages which, in turn, depend upon the pulse repetition rate of the pulse generator, i.e., upon the number of clock pulses which are to make up the interval between output pulses derived from the output A of n-input AND gate 46. These pulse generator output pulses are simply removed at output terminal 20.

As previously indicated, upon arrival of the mth clock pulse, the first (B) outputs of all flipflops will be ONEs. This condition will be represented by Table II.

TABLE II

| Flip Flop | Outputs B | $\overline{B}$ |
|---|---|---|
| FF7 | 1 | 0 |
| FF6 | 1 | 0 |
| FF5 | 1 | 0 |
| FF4 | 1 | 0 |
| FF3 | 1 | 0 |
| FF2 | 1 | 0 |
| FF1 | 1 | 0 |

A comparison of tables I and II reveals that, upon arrival of the mth clock pulse, the outputs $\overline{B}_5$, $\overline{B}_3$ and $\overline{B}_2$ from stages FF5, FF3, and FF2 must change from ZERO to ONE, while the outputs $B_5$, $B_3$, and $B_2$ must complementarily change from ONE to ZERO. The outputs $B_7$, $B_6$ and $B_4$ and $B_1$ remain at ONE, just as the complementary outputs $\overline{B}_7$, $\overline{B}_6$, $\overline{B}_4$ and $\overline{B}_1$ remain at ZERO.

Whenever a ZERO appears in the first (B) output of a given stage after the (m−1)th clock pulse, the second ($\overline{B}$) output of that given stage (which is a ONE) must be blocked from influencing the $\overline{B}$ output of the next stage during the next or mth clock pulse. For example, the ONE in the output $\overline{B}_5$ of stage FF5 must not be allowed to pass through AND gate 36 during the mth clock pulse C and cause $\overline{B}_6$=ZERO in FF6 to change to a ONE, since $B_6$ of flipflop FF6 must remain a ONE after the mth clock pulse and both outputs of FF6 cannot, of course, be a ONE at the same instant. For the same reason, the $\overline{B}_3$=ONE output of stage FF3 cannot be allowed to pass through AND gate 34 during the mth clock pulse C and cause a transition in the $\overline{B}_4$ output of the next flipflop FF4 from a ZERO to a ONE. Finally, the ONE in the $\overline{B}_2$ output of stage FF2 must not be permitted to pass through gate 33 since there must be a ZERO in the output $\overline{B}_3$ of stage FF3 after the mth clock pulse.

In order to prevent these undesirable transitions, additional AND gates 41b, 41c and 41d are inserted in series with respective AND gates 33, 34 and 36. The output $\overline{B}_2$ from stage FF2, the output $\overline{B}_3$ from stage FF3 and the output $\overline{B}_5$ from stage FF5 is connected to one input of respective additional AND gates 41b, 41c and 41d. The other input to the additional AND gates 41b to 41d is derived from the output of the inverter 45 following the n-input AND gate 46.

Further, if the output of exclusive OR gate 15 is a ZERO, which would be the case in the example assumed, since the outputs $B_6$ and $B_7$ of flipflops FF6 and FF7 are both ONEs, the output of inverter 16 will be a ONE. Since the $\overline{B}_1$ output of stage FF1 should remain ZERO after the mth clock pulse C, it is necessary to insert an additional AND gate 41a between the output of inverter 16 and the second input to AND gate 31 to preclude the possibility of the ONE at the output of inverter 16 from passing gate 31 during the mth clock pulse C and changing the $\overline{B}_1$ output of stage FF1 from a ZERO to a ONE. The output of inverter 16 is applied to an input of additional AND gate 41a. The other inputs to additional AND gates 41a, 41b, 41c and 41d are derived from the output of the inverter 45 associated with AND gate 46.

At the conclusion of the (m−1)th clock pulse, it will be evident that all inputs to the n-input AND gate 46 will be ONEs. Consequently, at this time—and only at this time—will there be a ONE at point A. Obviously, there will be an output pulse available at output terminal 20 at this particular time only. It follows that, at this particular time only, will there be a ZERO at the output of inverter 45. This ZERO output, when applied to additional AND gates 41a to 41d, will result in a ZERO in the output of these additional AND gates 41 and thus there will be no input to corresponding clocking AND gates 31, 33, 34 and 36 at the time of arrival of the mth clock pulse C at the four AND gates 31, 33, 34 and 36.

There is no ONE at point A for the mth clock pulse C or for clock pulses following the mth clock pulses up to 2m−1 clock pulses since one or more of the inputs to n-input AND gate 46 will be ZEROs. Except for the period between an (m−1)th clock pulse and an mth clock pulse, the output A of n-input AND gate 46 is ZERO and there is no pulse generator output at terminal 20. Furthermore, the output of inverter 45 is a ONE except during the period between the (m−1)th and the mth clock pulses so that additional AND gates 41a, 41b, 41c and 41d no longer block the output from inverter 16, output $\overline{B}_2$, output $\overline{B}_3$ and output $\overline{B}_5$, respectively.

Whenever, after the (m−1)th clock pulse, a ZERO appears in the first or B output of a given stage and in the B output of the next stage, that is, whenever two adjacent stages have a ZERO in the B output after the (m−1)th clock pulse, means must be provided to insure that the B output of said next stage becomes a ONE during the next (mth) clock pulse, since there is no ONE in the given stage to be transferred to the next stage and there is no ONE already in the next stage to be held. An example of this situation is one wherein, after m−1 clock pulses, outputs B₂ and B₃ of flipflops FF2 and FF3 are both ZERO. From comparison of Tables I and II, it is evident that the output B₃ of stage FF3 must change from ZERO to ONE at the mth clock pulse. Normally, however, AND gate 23 at stage FF3 would not allow for any transition from ZERO to ONE upon application of the mth clock to AND gate 23. To obviate this problem, an OR gate 51 is added into the input circuit of flipflop FF3. The input B₂ from stage FF2 is applied to one input of this added OR gate 51 and a ONE from the output point A of n-input AND gate 46 will be supplied to the other input of OR gate 51. Now a ONE will be available at the input to AND gate 23, along with the next (mth) clock pulse C, and the B output of stage FF3 will be caused to change from a ZERO to a ONE. The ZERO in the first of the two adjacent stages will have changed from ZERO to ONE as a result of the simultaneous presence of B₁=ONE from flipflop FF1 and the mth clock pulse at the inputs to AND gate 22.

During clock pulses other than the mth clock pulse, the output at point A of n-input AND gate 46 will be ZERO; however, by using the added OR gate 51, the B₂ output of stage FF2 will be supplied to OR gate 51 and, if B₂=ONE, the associated AND gate 23 would be enabled during the presence of a clock pulse other than the mth clock pulse. Although only one OR gate is shown in FIGURE, more than one such gate would be needed if there were more than two B=ZERO outputs in succession or more than one separated pair of successive stages having B outputs of ZERO.

An example will now be pointed out wherein the output of the Exclusive OR gate 15 and the B₁ output of the first stage FF1 are both ZERO. This condition is treated just as if two adjacent flipflops had B outputs of ZERO. In such a case, an additional OR gate would be used, one input being connected to the output of the Exclusive OR gate 15 and the other input being receptive of the output (point A) of the n-input AND gate 46. The output of this added OR gate would be connected to one input of the AND gate 21 along with the clock pulse at the other input of AND gate 21. This added OR gate would serve to insure that a ONE (from point A) is available at the B or first input of flipflop FF1 to affect a transition of the output B₁ of stage FF1 to a ONE during the mth clock pulse C at AND gate 21. It should be pointed out that the additional AND gate 41a would still be retained at the $\overline{B}$ input of stage FF1 since a ONE would exist at the output of inverter 16.

What is claimed is:

1. A pulse train generator comprising a feedback shift register having a plurality of cascaded clocked bistable stages each having complementary first and second output circuits and associated first and second input circuits, said generator producing an output pulse for each m clock pulses and having a pulse repetition rate greater than $r/(2^n-1)$ where n is the number of binary stages and r is the clock rate, said shift register having a discrete sequence of ONEs and ZEROs appearing in successive first output circuits upon arrival of each (m−1)th clock pulse, and logic gating means for converting said discrete sequence to ONEs in all of said first output circuits upon arrival of each mth clock pulse.

2. A pulse train generator according to claim 1 wherein said logic gating means includes an n-input AND gate which is receptive of those outputs of the n stages which contain a ONE after the (m−1)th clock pulse and an inverter in the output of said n-input AND gate.

3. A pulse train generator according to claim 2 wherein said logic gating means further includes an AND gate having an input coupled to the second output circuit of any given stage which contains a ZERO in the first output thereof in response to receipt of the (m−1)th clock pulse, said AND gate having the other input connected to the output of said inverter, and said AND gate having the output coupled to the second input circuit of a succeeding stage to said given stage.

4. A pulse train generator according to claim 2 or 3 wherein said logic gating means further includes an OR gate having one input coupled to the first output circuit of the first of two adjacent stages both of which contain a ZERO in response to receipt of the (m−1)th clock pulse and having the other input receptive of the output of said n-input AND gate, said OR gate having the output coupled to the first input circuit of the next one of said two adjacent stages.

5. A pulse train generator according to claim 2 or 3 further including an Exclusive OR gate connected to the first output circuits of the nth stage and another of said stages and an inverting means in the output circuit of said Exclusive OR gate, said logic gating means further including an AND gate having one input connected to the output of said inverting means whenever said output is a ONE in response to receipt of the (m−1)th clock pulse and having the other input connected to the output of said inverter, said AND gate having the output coupled to the second input circuit of said first stage.

6. A pulse train generator according to claim 5 wherein said logic gating means further including an OR gate having one input connected to the output of said Exclusive OR gate when said output and the output of the first stage is a ZERO in response to receipt of the (m−1)th clock pulse and having the other input connected to the output of said n-input AND gate, said OR gate having the output coupled to first input circuit of said first stage.

* * * * *